US 6,642,926 B1

(12) United States Patent
Letts

(10) Patent No.: US 6,642,926 B1
(45) Date of Patent: Nov. 4, 2003

(54) TEST AND MEASUREMENT INSTRUMENT HAVING TELECOMMUNICATIONS MASK TESTING CAPABILITY WITH A MASK ZOOM FEATURE

(75) Inventor: Peter J. Letts, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 278 days.

(21) Appl. No.: 09/607,573

(22) Filed: Jun. 29, 2000

Related U.S. Application Data

(60) Provisional application No. 60/155,977, filed on Sep. 24, 1999.

(51) Int. Cl.[7] .......................... G01R 13/20; G09G 3/36; G06F 13/00; G06F 12/02
(52) U.S. Cl. .................. 345/440.1; 345/474; 345/563; 345/556; 345/543; 345/538; 345/94; 702/57; 702/66; 702/67; 702/71; 702/73; 702/80
(58) Field of Search ................. 345/612–613, 345/616, 619, 627, 631, 632–634, 686–687, 440, 440.1, 441, 474, 719, 726, 764, 866, 520, 522, 543, 660, 626, 173, 177, 179, 690, 694, 176, 530–531, 538, 537, 204, 205, 208, 553, 554, 556, 563–565, 691, 214, 27, 94, 104; 702/66–71, 1, 57, 58, 73–74, 80–81, 84, 127, 117–118, 120, 122–126, 183, 185–186; 324/76.11, 394, 76.12, 76.22, 135, 121 R

(56) References Cited

U.S. PATENT DOCUMENTS

| | | | |
|---|---|---|---|
| 5,337,403 A | | 8/1994 | Klingman |
| 5,488,698 A | | 1/1996 | Oliver et al. |
| 6,195,080 B1 | * | 2/2001 | Etheridge ............... 324/121 R |
| 6,219,029 B1 | | 4/2001 | Flakne et al. |
| 6,320,577 B1 | * | 11/2001 | Alexander .................. 345/440 |
| 6,324,255 B1 | * | 11/2001 | Kondo et al. ............... 378/119 |
| 6,324,487 B1 | * | 11/2001 | Qian et al. .................. 702/147 |
| 6,332,116 B1 | * | 12/2001 | Qian et al. .................. 702/183 |
| 6,344,844 B1 | * | 2/2002 | Timm et al. ................. 345/134 |

FOREIGN PATENT DOCUMENTS

| | | | | |
|---|---|---|---|---|
| EP | 001089079 | * | 4/2001 | ........... G01R/13/20 |
| EP | 001094320 | * | 4/2001 | ........... G01R/13/30 |
| EP | 1094321 | * | 4/2001 | ........... G01R/13/20 |
| JP | 2001116770 | * | 8/2000 | ........... G01R/13/20 |

* cited by examiner

Primary Examiner—Matthew C. Bella
Assistant Examiner—Wesner Sa Jous
(74) Attorney, Agent, or Firm—Thomas F. Lenihan; William K. Bucher

(57) ABSTRACT

A telecom mask testing zoom function draws mask. pixels into a raster memory. In this way, the mask is treated as a waveform. Comparison of the mask pixels and waveform pixels to detect collision between a waveform pixel and a mask pixel (i.e., a mask violation) is performed substantially in real time, as the pixels are being composited into the raster memory by the rasterizer. The mask is scalable and repositionable by the rasterizer under control of a controller, because it is treated as a waveform. The mask is lockable to the waveform because both are stored in pixel form in raster memory by the rasterizer under control of the controller.

8 Claims, 4 Drawing Sheets

TEST AND MEASUREMENT INSTRUMENT HAVING TELECOMMUNICATIONS MASK TESTING CAPABILITY WITH A MASK ZOOM FEATURE

CLAIM FOR PRIORITY

The subject application hereby claims priority from United States Provisional Patent Application Ser. No. 60/155,977, entitled TELECOMMUNICATIONS MASK TESTING, filed Sep. 24, 1999 in the names of Peter J. Letts and Steven C. Herring.

CROSS REFERENCE TO RELATED APPLICATIONS

The subject application is related to U.S. patent application Ser. No. 09/602,575 filed on Jun. 22, 2000, bearing attorney docket number 7011-US1, entitled A TEST AND MEASUREMENT INSTRUMENT HAVING TELECOMMUNICATIONS MASK TESTING CAPABILITY WITH AN AUTOFIT TO MASK FEATURE, (Letts) assigned to the same assignee as the subject application, and also claiming priority from the above-identified U.S. Provisional application, and to U.S. patent application Ser. No. 09/619,067 filed on Jul. 19, 2000, bearing attorney docket number 7011-US3, entitled A TEST AND MEASUREMENT INSTRUMENT HAVING MULTI-CHANNEL TELECOMMUNICATIONS MASK TESTING CAPABILITY, (Letts and Herring), assigned to the same assignee as the subject application, and also claiming priority from the above-identified U.S. Provisional application.

FIELD OF THE INVENTION

The subject invention generally concerns test and measurement instruments, and in particular concerns those test and measurement instruments employing telecom mask features.

BACKGROUND OF THE INVENTION

In the telecommunications industry, it is commonplace to perform a test to determine if a particular signal is in compliance with parameters established by national and international communications standards bodies such as ITU-T and ANSI. A primary way to perform such a compliance test is to compare the pulse shape of a waveform acquired by an oscilloscope to a waveform "mask". The mask defines a pathway having minimum and maximum amplitude values, predetermined bit rate, and defined minimum slope on signal edges (i.e., minimum bandwidth). If the signal under test stays within the pathway boundaries, then the signal passes the test. This kind of test is known as Telecom Mask Testing.

A recent innovation in oscilloscope features has been a "AUTOSET TO MASK" function. The AUTOSET TO MASK function automatically sets up the horizontal, vertical, and triggering settings on the oscilloscope to accommodate the expected signal, and overlays a mask on the oscilloscope display. The procedure followed in the operation of an AUTOSET TO MASK function is to set the horizontal and vertical scales to a nominal value, acquire a waveform, and adjust the scale and position of the waveform by adjusting the settings of the input A/D converters, and display the mask.

After an AUTOSET TO MASK function sets up the acquired waveform and displays the mask, the telecom mask testing software checks for intrusions into the mask area by the waveform being tested (i.e., violations, or mask hits) that would indicate that the waveform does not comply with applicable telecommunications standards.

For many telecom applications it may be desirable to "zoom-in" on the display near the area (i.e., magnify the area) in which a violation occurred so that the user could perform a closer examination. Unfortunately, prior art telecom mask testing arrangements do not exhibit this capability for reasons to be explained below.

What is needed is a solution that allows the mask and the waveform under test to be "locked together" for horizontal and vertical repositioning, and "zoomed" (i.e., magnified) for closer inspection.

SUMMARY OF THE INVENTION

A telecom mask testing zoom function draws mask. pixels into a raster memory. In this way, the mask is treated as a waveform. Comparison of the mask pixels and waveform pixels to detect collision between a waveform pixel and a mask pixel (i.e., a mask violation) is performed substantially in real time, as the pixels are being composited into the raster memory by the rasterizer. The mask is scalable and repositionable by the rasterizer under control of a controller, because it is treated as a waveform. The mask is lockable to the waveform because both are stored in pixel form in raster memory by the rasterizer under control of the controller.

DETAILED DESCRIPTION OF THE DRAWING

Figure 1:
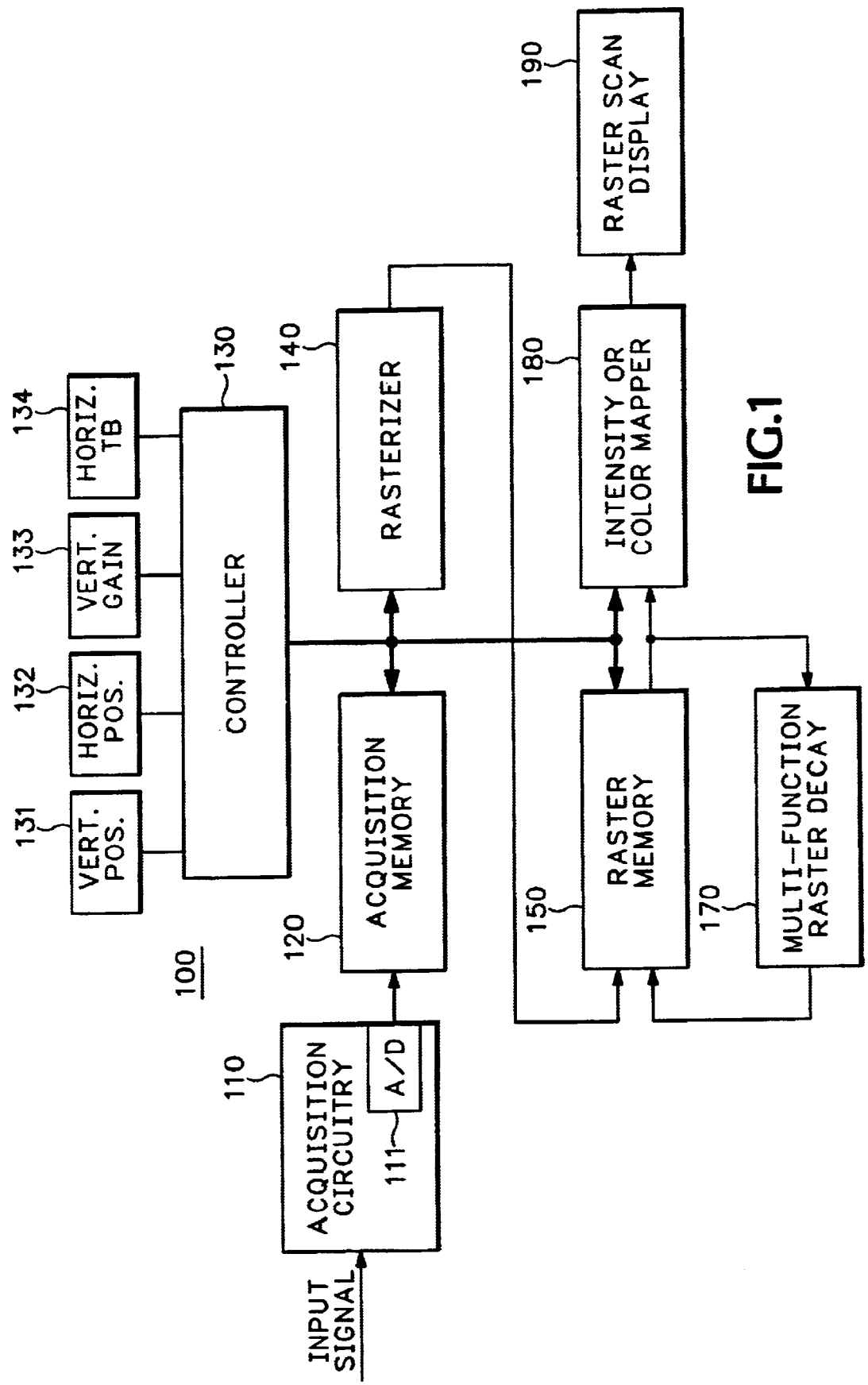
FIG. 1 is a simplified schematic of an oscilloscope suitable for use with the invention.

FIG. 1 shows, in simplified block diagram form, a digital oscilloscope 100 useful for practicing the invention. Such an oscilloscope may be, for example, a TDS-3000 Digital Phosphor Oscilloscope (DPO) manufactured by Tektronix, Inc., Beaverton, Oreg.

An input signal is applied to ACQUISTION CIRCUITRY 110 including an A/D (analog to digital) converter 111. ACQUISTION CIRCUITRY 110 substantially continuously samples the applied input signal at high speed and stores the samples in an ACQUISITION MEMORY 120.

In operation, digital oscilloscope 100 acquires information about the behavior of the input signal (i.e., a waveform) by periodically sampling the voltage present at the point where a probe (not shown for simplicity) is in contact with some node of a circuit under observation. The oscilloscope probe and front end of oscilloscope 100 are designed to precisely replicate the signal, or some predetermined fraction or multiple of the signal, and present it to A/D converter 111. The output of A/D converter 111 is a series of multi-bit digital words that are stored in ACQUISITION MEMORY 120. Successively acquired samples are stored at sequentially related addresses in the acquisition memory, and are thereby related to a time scale. Data at those addresses will eventually be converted back to a time scale by a RASTERIZER 140, and stored in a RASTER MEMORY 150. Display hardware such as INTENSITY OR COLOR MAPPER 180 reads the contents of RASTER MEMORY 150 and applies the data to a RASTER SCAN DISPLAY 190. The time scale, referred-to above, is represented as horizontal distance along the x-axis of the oscilloscope's RASTER SCAN DISPLAY 190.

For purposes of background information, a raster consists of horizontal rows and vertical columns. Each row can be identified by a location number along the vertical axis (y-axis), while each column can be identified by a location number along the horizontal axis (x-axis). Typically, in a digital oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

RASTERIZER 140 forms a composite multi-bit grayscale waveform by reading the contents of ACQUISITION MEMORY 120, reading the contents of the relevant location of RASTER MEMORY 150, combining the two and storing (i.e., compositing) the resulting value back into RASTER MEMORY 150. At substantially the same time, a MULTI-FUNCTION RASTER DECAY unit 170 reads the contents of RASTER MEMORY 150 and decrements the data at a predetermined rate, and stores the decayed value back into RASTER MEMORY 150 for later display. All of the above-described functions may operate under control of a CONTROLLER 130, which may be, for example, a PowerPC G3 microprocessor, a dedicated ASIC, or alternatively, CONTROLLER 130 may be implemented as multiple processors. Four user controls are shown coupled to CONTROLLER 130. The controls are a HORIZONTAL POSITION CONTROL 131 a VERTICAL POSITION CONTROL 132, an AMPLITUDE (gain) CONTROL 133, and, a HORIZONTAL TIMEBASE CONTROL 134.

Figure 2:
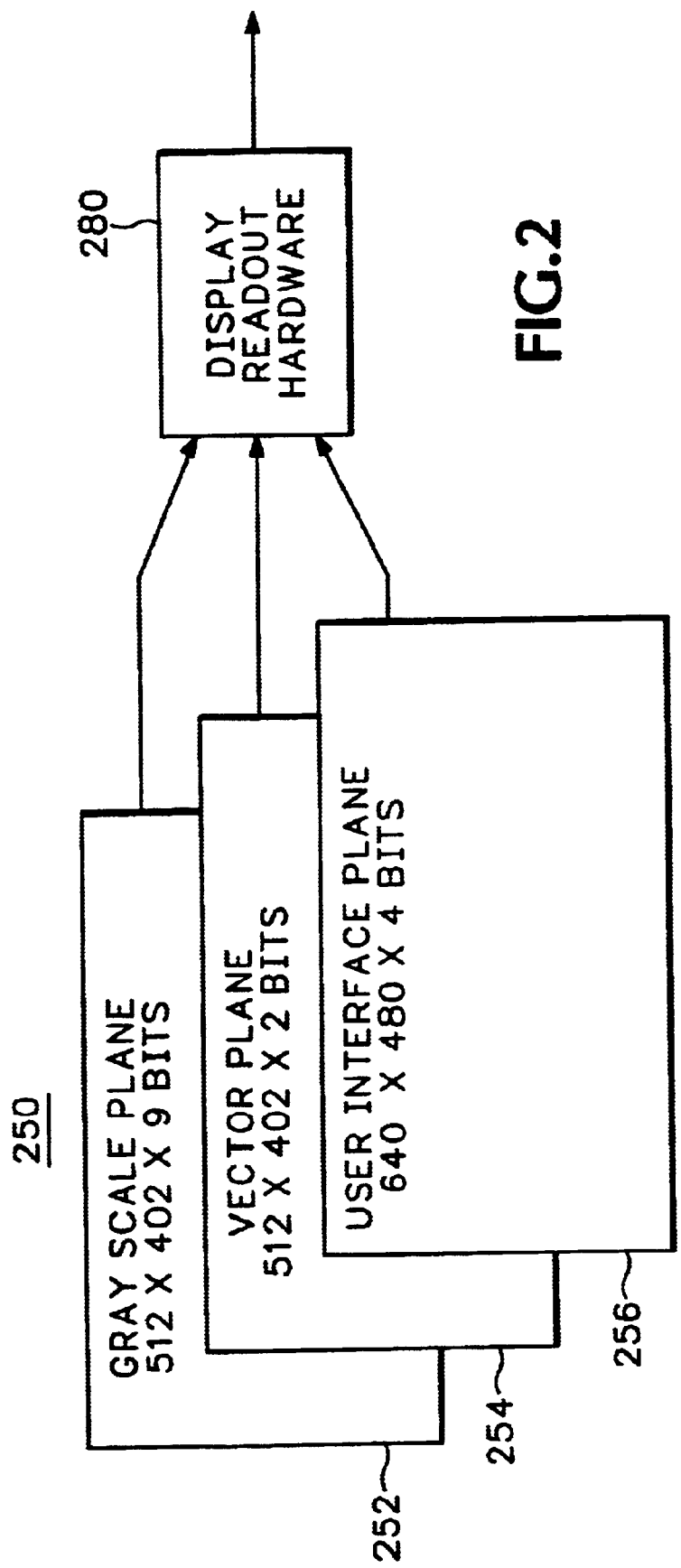
FIG. 2 is a simplified representation of the planes of memory employed by the apparatus of FIG. 1.

RASTER MEMORY 150 is shown in greater detail as RASTER MEMORY 250 in FIG. 2. RASTER MEMORY 250 comprises three planes of memory, a GRAY SCALE (GS) PLANE 252, a VECTOR PLANE 254, and a UI (User Interface) PLANE 256. One skilled in the art will realize that while it is easy to think of this structure in terms of memory "planes", they are really just contiguous blocks of fast SRAM display memory.

Waveform data is written into GS PLANE 252, which is an array of 205,824 memory locations arranged in a 512 by 402 matrix, with each memory location being nine bits long. The nine bits define intensity, color, and whether the pixel is a mask pixel or a waveform pixel.

VECTOR PLANE 254 is used for displaying waveforms resulting from mathematical operations (for example, the sum of the signals from channel 1 and channel 2), or for displaying a previously stored reference waveform. VECTOR PLANE 254 is an array of 205,824 memory locations arranged in a 512 by 402 matrix, with each memory location being two bits long. It is noted in passing that two bits will define three levels of illumination and the "OFF" state for a given pixel.

UI PLANE 256 is used to store pixel data associated with text characters, and it encompasses the entire 640 by 480 screen area. Thus, UI PLANE 256 is an array of 307,200 memory locations arranged in a 640 by 480 matrix, with each memory location being four bits long. The four bits define color and illumination level for a given pixel.

The output signals from the three planes 252, 254, and 256 are read out and combined for display in DISPLAY READOUT HARDWARE unit 280, typically at a 60 Hz rate.

Figure 3:
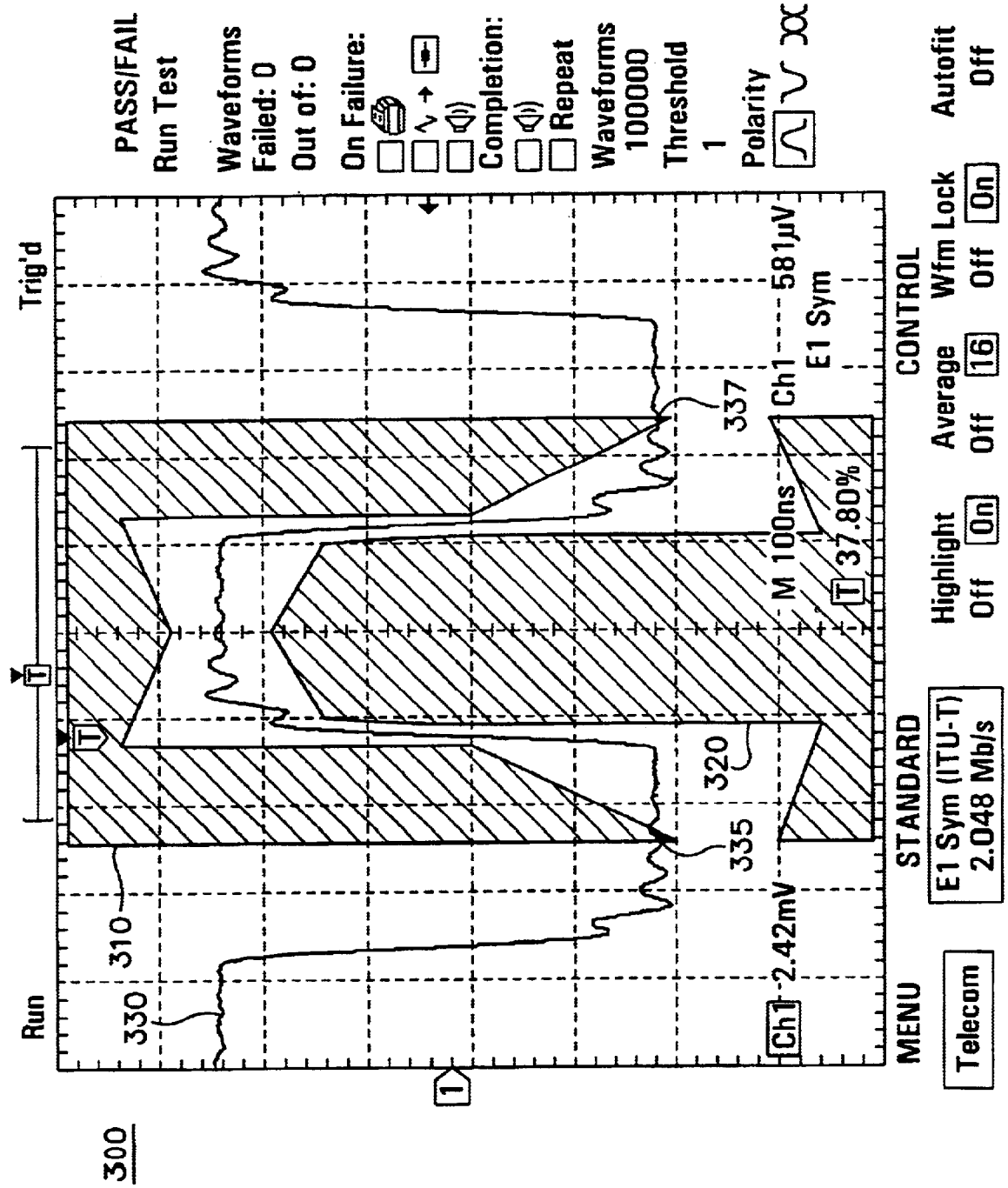
FIG. 3 shows a screen display of a telecom mask and waveform in accordance with one embodiment of the subject invention.

FIG. 3 shows two parts of a typical telecom mask 310, 320 displayed on a display screen of an oscilloscope. Controller 130 of FIG. 1 draws the telecom mask into display memory. It is drawn as a series of polygons (e.g. trapezoids) defined by a series of stored X-Y points. The telecom mask may be drawn into either of two memory planes depending upon its ultimate purpose. If the purpose is simply to view the telecom mask, or to move it about the screen, then it is drawn into VECTOR PLANE 254. However, if the purpose is to perform a comparison with waveform data as in copending U.S. patent application Ser. No. 09/602,575 entitled A TEST AND MEASUREMENT INSTRUMENT HAVING TELECOMMUNICATIONS MASK TESTING CAPABILITY WITH AN AUTOFIT TO MASK FEATURE, (Letts), (herein incorporated by reference) then the telecom mask is drawn into the GS PLANE 252. This is required because the rasterizer must have access to both the waveform data and the telecom mask data in order to detect violations (i.e., make a collision determination) between the two, as the pixels are being drawn into GS PLANE 252 of RASTER MEMORY 250.

Referring to FIG. 3, a display screen 300 of a digital oscilloscope, or the like, has displayed thereon, a telecom mask having an upper portion 310 and a lower portion 320. Each of upper portion 310 and lower portion 320 comprises individual segments composed of polygons (e.g., trapezoids).

Assume that an AUTOSET TO MASK feature has placed telecom mask 310, 320 on the display screen (written it into RASTER MEMORY 150) and has acquired and adjusted waveform 330 to nominal values. A portion of the AUTOFIT TO MASK function (referred-to above) now takes control, and prevents decay of any pixel data in the mask area (so that the mask does not have to be continually redrawn). Note that in the menu at the bottom of display screen 300, a menu option AUTOFIT OFF has been selected. If the full AUTOFIT function were turned on, then the waveform would have been repeatedly redrawn at a sequence of new locations with respect to the mask until it finally produced no mask violations.

Recall that existing data is read out of the relevant location of GS PLANE 252 of RASTER MEMORY 250 before new data is written into it. The existing data is combined with the new data for implementing the incrementing portion of the gray scaling feature (the decrementing portion of the gray scaling feature being accomplished by MULTI-FUNCTION RASTER DECAY unit 170). The combined data is then written back into the memory for display.

In the apparatus of FIG. 1, collision detection between waveform pixels and mask pixels is implemented at the point when the existing RASTER MEMORY data and the waveform data are being combined by RASTERIZER 140. Thus, if the existing pixel data indicates that this pixel is part of the telecom mask, a collision between the waveform pixel and the mask pixel (i.e., a mask violation) is detected. In this regard, waveform 330 is illustrated as violating the telecom mask at points 335 and 337 due to an offset error.

At this point, an operator of the oscilloscope can choose to examine the area in which the mask violation occurred. To do so, the operator selects a waveform lock (Wfm Lock) option as shown in the menu in the lower portion of FIG. 3.

Selection of the waveform lock feature causes controller 130 to make both the waveform and the mask to track one another with respect to changes in settings of HORIZONTAL POSITION 131 and VERTICAL POSITION 132 controls, and with respect to changes in the settings of the AMPLITUDE (vertical gain) 133 and HORIZONTAL TIMEBASE 134 controls.

By use of the horizontal and vertical position controls, an operator can move both the mask and the waveform from place to place on the screen display while maintaining their relative placement to one another. By use of the amplitude and horizontal timebase settings, an operator can magnify (i.e., "zoom-in on ") a portion of the display, while maintaining the relative placement of the magnified waveform portion and telecom mask portion.

Figure 4:
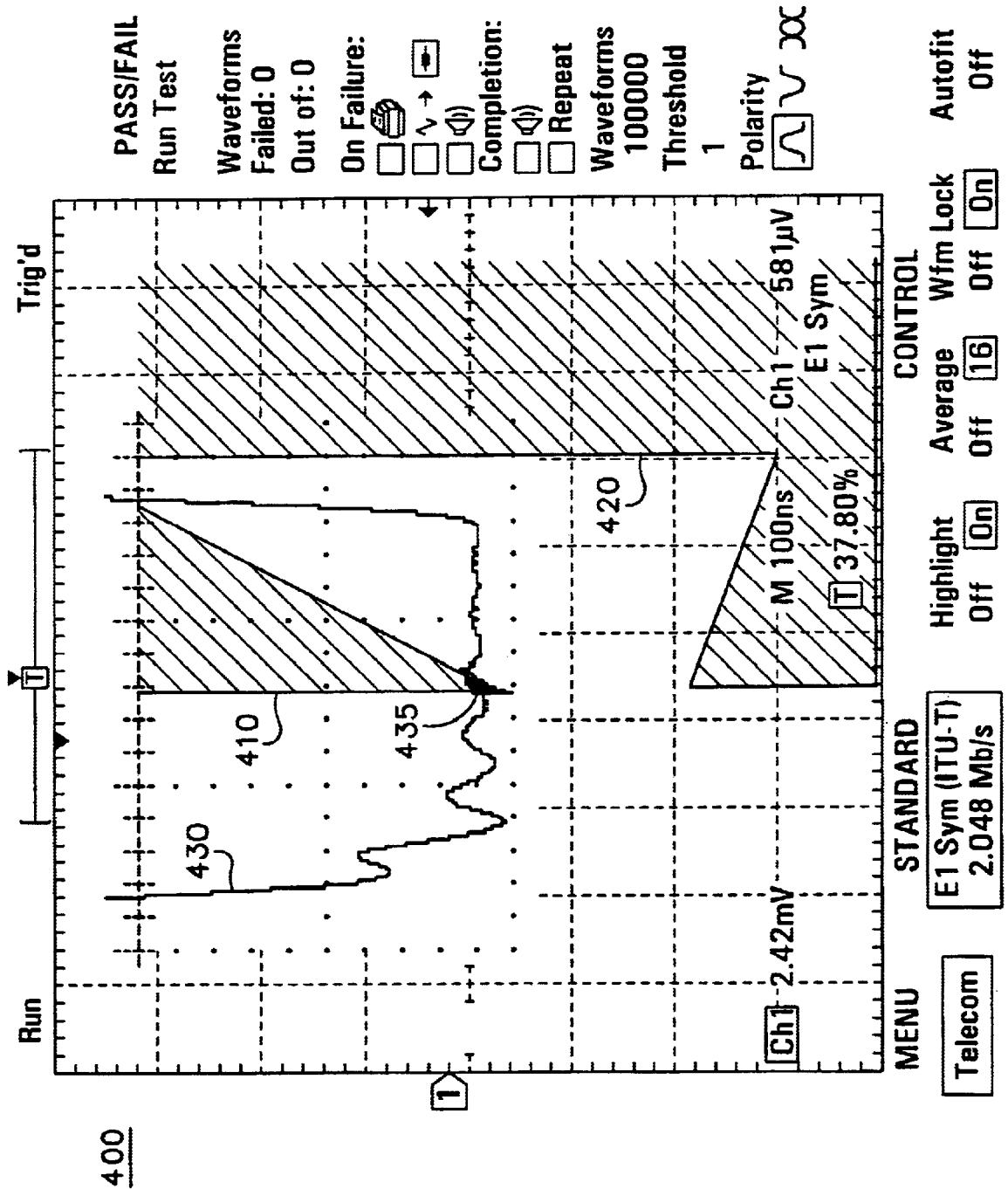
FIG. 4 is an illustration showing a magnified view of a portion of FIG. 3.

In this regard, a magnified image of mask portions 410 and 420 and of waveform 430 are shown in FIG. 4. CONTROLLER 130 begins the transformation of the image of FIG. 3 into that of FIG. 4 by reading the settings of HORIZONTAL POSITION CONTROL 131 a VERTICAL POSITION CONTROL 132, an AMPLITUDE (Vertical Gain) CONTROL 133, and, a HORIZONTAL TIMEBASE CONTROL 134. CONTROLLER 130 then computes the proper Raster Memory locations to which waveform and mask pixels are written by RASTERIZER 140. In operation, RASTERIZER 140 contains circuitry (not shown) that performs scaling, intensity, and position changes in response to control values written to control registers by CONTROLLER 130. In this way, scaling and position changes can be accomplished quickly and without affecting the raw data. The result of this scaling operation is shown in FIG. 4 in which a position 435 represents the mask violation area 335 of FIG. 3.

It is herein recognized that CONTROLLER 130 may be a microprocessor or a dedicated ASIC, or other form of controller, and such modification is deemed to lie with the scope of the present invention.

What has been described is a very high-speed method and apparatus for repositioning and magnifying waveform and a telecom mask while maintaining the spatial relationship between them.

It is also herein recognized that treatment of the mask as raster memory pixel data, in the same manner as the waveform is treated, provides the desired scalability of the telecom mask.

Although the subject invention was described with respect to a digital oscilloscope, it is herein recognized that the invention may be applicable to other test and measurement equipment, such as a logic analyzer, or a communications network analyzer, or the like.

While the X-Y points for generating the mask were described as previously stored, one skilled in the art will appreciate that the user can download his own data from a PC through a data port of the test and measurement instrument in order to create custom masks.

What is claimed is:

1. A test and measurement instrument having mask testing capability, comprising:

an acquisition system for acquiring samples of a waveform;

a controller for generating mask pixel data defining a mask;

a memory for storing said waveform samples and said mask pixel data, said mask pixel data including an identification code;

a rasterizer for reading data from a memory location of said memory, combining said data with said waveform samples, and writing a result of said combining into said memory location;

display circuitry coupled to said memory for displaying said mask and said waveform; and a plurality of input devices, coupled to said controller, said devices being subject to adjustment by a user for affecting waveform position and scale on a display;

said controller causing said rasterizer to maintain a spatial relationship between a display of said waveform and a display of said mask when one of said plurality of input devices is adjusted to change one of said position and said scale on said display.

2. The test and measurement instrument of claim 1 wherein, said memory is a raster memory; and said mask pixels and said waveform samples are composited into said raster memory.

3. The test and measurement instrument of claim 2 wherein said controller generating mask pixels is a microprocessor.

4. The test and measurement instrument of claim 3 wherein said controller generating mask pixels is a dedicated ASIC.

5. The test and measurement instrument of claim 1 further comprising:

a data port for receiving data relating to said mask;

said controller being coupled to said data port and generating a mask from said data relating to said mask.

6. The test and measurement instrument of claim 1 wherein:

said test and measurement instrument is a digital oscilloscope.

7. A method for changing one of scale and position of a mask and waveform display in a test and measurement instrument having mask testing capability, comprising the steps of:

acquiring samples of a waveform;

generating mask pixel data defining a mask;

storing said waveform samples and said mask pixel data in a memory, said mask pixel data including an identification code;

reading data from a memory location of said memory, combining said data with said waveform samples, and writing a result of said combining into said memory location;

displaying a representation of said mask and said waveform; and reading settings of a plurality of input devices, coupled to a controller, said devices being subject to adjustment by a user for affecting waveform position and scale on a display; and maintaining a spatial relationship between a display of said waveform and a display of said mask when one of said plurality of input devices is adjusted to change one of said position and said scale on said display.

8. The method of claim 7 wherein, said memory is a raster memory; and said waveform samples and said mask pixels are composited into said raster memory.

\* \* \* \* \*